(12) United States Patent
Sumakeris (10) Patent No.: US 7,279,115 B1
(45) Date of Patent: *Oct. 9, 2007

(54) METHOD TO REDUCE STACKING FAULT NUCLEATION SITES AND REDUCE $V_F$ DRIFT IN BIPOLAR DEVICES

(75) Inventor: Joseph John Sumakeris, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/389,825

(22) Filed: Mar. 27, 2006

Related U.S. Application Data (63) Continuation-in-part of application No. 10/605,312, filed on Sep. 22, 2003, now Pat. No. 7,018,554.

(51) Int. Cl.
*C23F 1/00* (2006.01)

(52) U.S. Cl. .................... 216/67; 216/38; 216/83; 216/90; 438/507; 438/692; 438/745; 438/931; 117/951

(58) Field of Classification Search ............... 216/83, 216/90, 67; 438/692, 745, 931; 117/951
See application file for complete search history.

(56) References Cited

U.S. PATENT DOCUMENTS

| | | | |
|---|---|---|---|
| 4,865,685 A | 9/1989 | Palmour | |
| 4,912,063 A | 3/1990 | Davis et al. | |
| 4,912,064 A | 3/1990 | Kong et al. | |
| 4,946,547 A | 8/1990 | Palmour et al. | |
| 4,981,551 A | 1/1991 | Palmour | |
| 5,227,034 A | 7/1993 | Stein et al. | |
| 5,571,374 A | 11/1996 | Thero et al. | |
| 5,679,153 A | 10/1997 | Dmitriev et al. | |
| 5,709,745 A | 1/1998 | Larkin et al. | |

(Continued)

FOREIGN PATENT DOCUMENTS

EP          1 288 346 A          3/2003

(Continued)

OTHER PUBLICATIONS

Taro Nishiguchi et al.; A Proposal for CVD Growth of 15R-SiC by Observing the Etch Pits on 15R-SiC (0001) C-face; Journal of Crystal Growth (2002); vol. 237-239; pp. 1239-1243; Elsevier Science B.V.

(Continued)

*Primary Examiner*—Shamim Ahmed
(74) *Attorney, Agent, or Firm*—Summa, Allan & Additon, P.A.

(57) ABSTRACT

A method is disclosed for preparing a substrate and epilayer for reducing stacking fault nucleation and reducing forward voltage ($V_f$) drift in silicon carbide-based bipolar devices. The method includes the steps of etching the surface of a silicon carbide substrate with a nonselective etch to remove both surface and subsurface damage, thereafter etching the same surface with a selective etch to thereby develop etch-generated structures from at least any basal plane dislocation reaching the substrate surface that will thereafter tend to either terminate or propagate as threading defects during subsequent epilayer growth on the substrate surface, and thereafter growing a first epitaxial layer of silicon carbide on the twice-etched surface.

22 Claims, 3 Drawing Sheets

U.S. PATENT DOCUMENTS

| | | |
|---|---|---|
| 5,895,583 A | 4/1999 | Augustine et al. |
| 5,900,647 A | 5/1999 | Inoguchi |
| 5,915,194 A | 6/1999 | Powell et al. |
| 5,944,890 A | 8/1999 | Kitou et al. |
| 6,034,001 A | 3/2000 | Shor et al. |
| 6,100,111 A | 8/2000 | Konstantinov |
| 6,297,522 B1 | 10/2001 | Kordina et al. |
| 6,428,621 B1 | 8/2002 | Vodakov et al. |
| 6,508,880 B2 | 1/2003 | Vodakov et al. |
| 6,534,026 B2 | 3/2003 | Vodakov et al. |
| 6,562,130 B2 | 5/2003 | Vodakov et al. |
| 7,018,554 B2 * | 3/2006 | Sumakeris ............... 216/67 |
| 2002/0023581 A1 | 2/2002 | Vodakov et al. |
| 2002/0038627 A1 | 4/2002 | Vodakov et al. |
| 2002/0049129 A1 | 4/2002 | Vodakov et al. |
| 2002/0059901 A1 | 5/2002 | Vodakov et al. |
| 2002/0069818 A1 | 6/2002 | Naito et al. |
| 2002/0170491 A1 | 11/2002 | Mueller |
| 2003/0062335 A1 | 4/2003 | Brewer |
| 2003/0080842 A1 | 5/2003 | Sumakeris et al. |

FOREIGN PATENT DOCUMENTS

| | | |
|---|---|---|
| EP | 1 215 730 A | 6/2003 |
| JP | 07 97299 | 8/1995 |

OTHER PUBLICATIONS

Glenn Beheim et al.; Deep RIE Process for Silicon Carbide Power Electronics and MEMS; Materials Research Society Symposium Proceedings; 2000; vol. 622; pp. 1-6; Materials Research Society.

M. Kayambaki et al.; Crystal Quality Evaluation by Electrochemical Preferential Etching of p-Type SiC Crystals; Journal of the Electrochemical Society (2000); vol. 147 (7); pp. 2744-2748; The Electrochemical Society, Inc.

Hiroshi Noda; Study on Surface Defects Formed on 4H-SiC Epitaxial Thin Films; pp. 5-6 (2 pgs.), no date provided.

Streetman, Solid State Electronic Devices, 1990, Prentice Hall, 3rd ed., pp. 130-131.

* cited by examiner

METHOD TO REDUCE STACKING FAULT NUCLEATION SITES AND REDUCE $V_F$ DRIFT IN BIPOLAR DEVICES

RELATED APPLICATIONS

This is a continuation-in-part of Ser. No. 10/605,312 filed Sep. 22, 2003 and now U.S. Pat. No. 7,018,554.

FEDERAL RESEARCH STATEMENT

This invention was developed under government contract No. N00014-02-C-0302. The U.S. Government has a paid-up license in this invention and the right in limited circumstances to require the patent owner to license others on reasonable terms as provided for by the terms of contract No. N00014-02-C-0302 awarded by the Defense Advanced Research Projects Agency ("DARPA").

BACKGROUND

The present invention relates to increasing the quality and desired properties of semiconductor materials used in electronic devices, particularly power electronic devices. In particular, the invention relates to an improved process for minimizing crystal defects in silicon carbide, and the resulting improved structures and devices. The present invention is related to the subject matter disclosed and claimed in commonly assigned U.S. Pat. No. 6,849,874; the contents of which are incorporated entirely herein by reference.

Silicon Carbide

Silicon carbide (SiC) has emerged over the last two decades as an appropriate candidate semiconductor material that offers a number of advantages over both silicon and gallium arsenide. In particular, silicon carbide has a wide bandgap, a high breakdown electric field, a high thermal conductivity, a high saturated electron drift velocity, and is physically extremely robust. In particular, silicon carbide has an extremely high melting point and is one of the hardest known materials in the world.

Because of its physical properties, however, silicon carbide is also relatively difficult to produce. Because silicon carbide can grow in many polytypes, it is difficult to grow into large single crystals. The high temperatures required to grow silicon carbide also make control of impurity levels (including doping) relatively difficult, and likewise raise difficulties in the production of thin films (e.g. epitaxial layers). Because of its hardness, the traditional steps of slicing and polishing semiconductor wafers are more difficult with silicon carbide. Similarly, its resistance to chemical attack make it difficult to etch in conventional fashion.

In particular, silicon carbide can form over 150 polytypes, many of which are separated by relatively small thermodynamic differences. As a result, growing single crystal substrates and high quality epitaxial layers ("epilayers") in silicon carbide has been, and remains, a difficult task.

Nevertheless, based on a great deal of research and discovery in this particular field, including that carried out by the assignee of the present invention, a number of advances have been made in the growth of silicon carbide and its fabrication into useful devices. Accordingly, commercial devices are now available that incorporate silicon carbide to produce blue and green light emitting diodes, as a substrate for other useful semiconductors such as the Group III nitrides, for high-power radio frequency (RF) and microwave applications, and for other high-power, high-voltage applications.

As the success of silicon-carbide technology has increased the availability of certain SiC-based devices, particular aspects of those devices have become more apparent. In particular, it has been observed that the forward voltage (also referred to as "forward bias") of silicon carbide-based bipolar devices tends to increase noticeably during operation of those devices. For a number of reasons, such functional problems in semiconductor devices can often result from defects in the crystal structure of the material from which the devices are formed.

Crystallographic Defects

At the most basic level, structural crystallographic defects fall into four categories: point defects, line defects, planar defects and three dimensional defects. Point defects include vacancies, line defects include dislocations, planar defects include stacking faults and three-dimensional defects include polytype inclusions.

A dislocation is a kind of structural imperfection that extends for many unit cell lengths throughout a crystal. A more definite description of dislocation classifies them as screw and edge dislocations. As recognized by those persons skilled in this art, a symmetrical path followed from atom to atom (or from ion to ion) in a real crystal that returns upon itself, it is referred to as a Burgers circuit. If the same path in the lattice that typifies the structure does not return upon itself, so that the beginning and end do not lie on the same atom, then the Burgers circuit encloses one or more dislocations. The vector that completes the closed circuit in the lattice is referred to as the Burgers vector and measures the magnitude and direction of the dislocation.

If the Burgers vector is parallel to the line that locates the dislocation, the defect is referred to as a screw dislocation. Alternatively, if the Burgers vector is perpendicular to the dislocation, it is referred to as an edge dislocation. The simplest version of an edge dislocation is an incomplete plane of atoms or ions interleaved between two normal planes in a manner somewhat analogous to an extra card inserted halfway into a deck. On one side of the dislocation line, the planes separate to make room for the extra layer; on the other side the planes compress due to the absent layer.

Screw dislocations are not necessarily disadvantageous and, in fact, can be particularly important for the growth of a crystal face. A screw dislocation always presents one edge that is one or a few atoms high. At this edge, continued growth of the crystal is relatively easy. Dislocations, however, allow plastic flow to occur in a crystal relatively easily. In a limited region, the dislocation line created by the dislocation may be almost a straight line. Any plane that contains the Burgers vector and a segment of the dislocation line is referred to as a "slipped plane". The edge dislocation moves relatively easily through the crystal because motion in the slipped plane involves only a slight displacement of the structural elements. Stated differently, the slipped planes provide a low-energy intermediate state by which a crystal can be reorganized.

Defects in Silicon Carbide

In silicon carbide power devices, the availability of such relatively low-energy intermediate state encourages faults to continue to grow as the operation of the device provides the relatively small amount of energy necessary for the crystal reorganization.

Commercial quality SiC wafers and epilayers include both screw and edge dislocations. These dislocations can be further grouped by their alignment within the crystal. Those dislocations that propagate along the c-axis are called threading dislocations, while dislocations that lie within the c-plane are termed basal plane dislocations. In general, in SiC, it is energetically favorable that basal plane dislocations preferentially decompose into partial dislocations via the mechanism described below:

$$\frac{1}{3}\langle 11\bar{2}0\rangle \rightarrow \frac{1}{3}\langle 10\bar{1}0\rangle + \frac{1}{3}\langle 01\bar{1}0\rangle \qquad \text{Equation 1}$$

The above decomposition reaction describes the decomposition of a basal plane dislocation into two Shockley partial dislocations. The line defects generated during the above decomposition will bound a planar stacking fault defect. In fact, partial dislocations will bind the entire perimeter of the stacking fault unless the stacking fault reaches a free surface. This stacking fault will be electrically active in bipolar devices and during forward operation, the electron-hole plasma will be reduced in the vicinity of the stacking fault. The reduced plasma density will increase the forward voltage ($V_f$) of the device. A further complication is that through dislocation enhanced dislocation glide, the stacking fault may continue to expand during forward operation of the device. This behavior is a substantial barrier to device exploitation because it results in devices with functional properties that can change unpredictably during operation.

Stated differently, the application of electric current through a silicon carbide bipolar device tends to initiate or propagate (or both) changes in the crystal structure. As noted above, many SiC polytypes are in close thermodynamic proximity, and solid phase transformations are quite possible. When the stacking faults progress too extensively, they tend to cause the forward voltage to increase in an undesirable manner that can prevent the device from operating as precisely as required or desired in many applications.

In some conventions, dislocation density is described by centimeters of dislocation length per cubic centimeter of material, and thus report dislocation density units of per square centimeter ($cm^{-2}$). In another convention (and as used herein) the off-axis orientation of 4H—SiC substrates for SiC epilayer growth and the common etch technique used to detect dislocations make it more convenient to use etch pit density (also in the units of $cm^{-2}$), to describe dislocation densities in SiC. Those of skill in this art will thus recognize that for a given dislocation density expressed as $cm/cm^3$, one could get a very different dislocation pit density when expressed as $pits/cm^2$ depending on the typical dislocation configuration and the off-axis angle of the substrate. Therefore, although the two numbers will have the same net units ($cm^{-2}$), they do not necessarily indicate the same actual dislocation density. For the sake of clarity and consistency, in this disclosure, dislocation density will only be described as the density of specific pits delineated on an etched epi-surface of a silicon face prepared, 8° off-axis (0001) oriented substrate.

Figure 1:
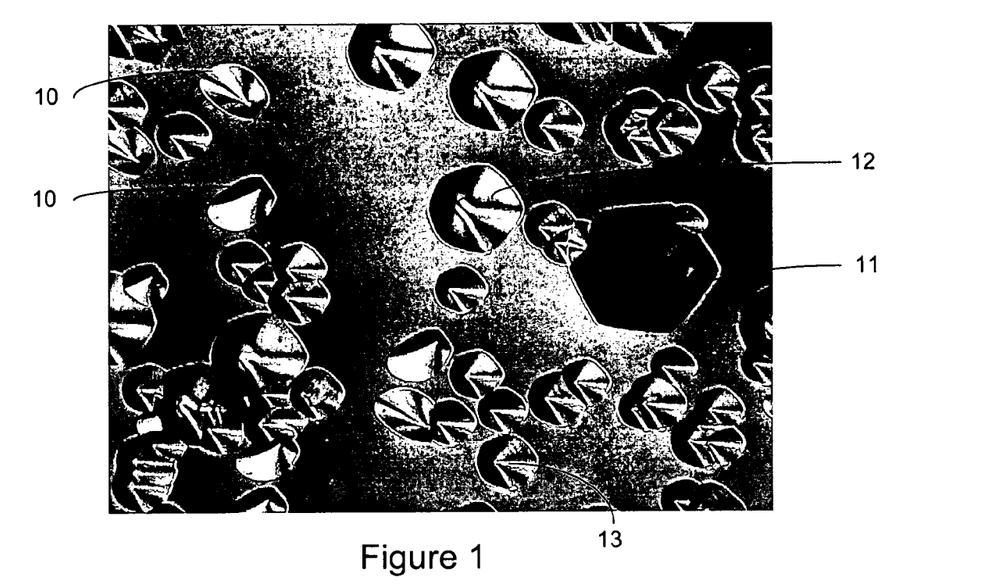
FIG. 1 is a photograph of the surface of a SiC substrate following an etch in molten KOH.

Present commercially available 4H—SiC substrates have approximately 1E3 to 1E5 ($10^3$-$10^5$) dislocations per $cm^2$ by the convention used herein. This includes threading screw and edge dislocations, micropipes and basal plane dislocations. FIG. 1 is a micrograph of KOH-etched epilayer surface revealing various common types of dislocation pits (the exact nature of which are set forth in the Detailed Description). All types of dislocations can impact device performance, but the basal plane dislocation is particularly implicated as being the prevalent nucleation site of the stacking faults that cause $V_f$ drift.

In turn, defects in the substrate are often replicated in epitaxial layers grown on such substrates, thus making substrate crystal quality an important factor with respect to the quality and performance of resulting devices.

Conventional substrate preparation and epilayer growth practices will fairly effectively reduce the density of basal plane dislocations from 1E3-1E4 $cm^{-2}$ in the substrate to about 400 $cm^{-2}$ in the epilayer. This reduction in dislocation density is accomplished via changes in both the substrate preparation and the epilayer growth operations.

Because SiC is a very hard material, preparing a typical substrate requires fairly aggressive sawing, lapping and polishing operations. These steps all generate sub-surface damage including enormous numbers of dislocations, including basal plane dislocations. To remove this damaged region, in practice, a less aggressive final preparation, such as chemical mechanical polishing (CMP) or a dry etch is employed after wafer shaping to remove sub-surface damage. The inventors herein have observed, however, that in many cases sub-surface damage propagates several microns beyond the depth removed by such conventional final surface preparation. In particular, and without wishing to be bound by any particular theory, it is hypothesized (but not yet confirmed) that damage from the sawing operation is the predominant cause of the residual damage.

Accordingly, continued improvement in the structure and operation of SiC-based bipolar devices will require continued improvements in the underlying substrates and their crystal structures.

SUMMARY OF THE INVENTION

The invention is a method of preparing a substrate for reducing stacking fault nucleation and reducing forward voltage ($V_f$) drift in silicon carbide-based bipolar devices. The method includes the steps of conducting a first non-selective etch on the surface of a silicon carbide substrate to remove both surface and subsurface damage; thereafter conducting a selective etch on the same surface sufficient to delineate the intersection of basal plane dislocations with the wafer surface and that will thereafter tend to propagate into epilayers as threading defects while avoiding creating beta (3C) inclusions and carrot defects; growing an epitaxial layer on the selectively etched substrate surface to a thickness greater than that of the typical threading etch pit depth in the selectively-etched surface to thereby provide the epitaxial layer with a sufficient thickness to support additional polishing and etching steps above the substrate; polishing away a sufficient portion of the epitaxial layer to remove the material containing the etched pits to thereby provide a surface with fewer etched pits than the surface of the selectively-etched substrate; and conducting a second non-selective etch of the epilayer sufficient to remove subsurface damage from the step of polishing the epitaxial layer but without reaching the underlying substrate, to thereby reduce the number of subsurface defects that can propagate stacking faults under forward voltage in a device formed on the substrate and the polished epilayer.

The foregoing and other objects and advantages of the invention and the manner in which the same are accomplished will become clearer based on the followed detailed description taken in conjunction with the accompanying drawings.

DETAILED DESCRIPTION

The invention is a method of preparing a substrate for reducing stacking fault nucleation and reducing forward voltage ($V_f$) drift in silicon carbide-based bipolar devices.

In a first embodiment the method initially comprises conducting a non-selective etch, preferably a dry etch, most preferably a reactive ion etch (RIE), on the surface of a silicon carbide substrate to remove both surface and subsurface damage that typically results from the sawing and lapping of the extremely hard SiC material. As known to those familiar with the manufacture of electronic devices, a nonselective etch removes all material at an equal rate. A selective etch removes specific materials—e.g. damaged, n-type, p-type—more quickly than the other materials. Exemplary, but not limiting, techniques for dry etching of silicon carbide are set forth in U.S. Pat. No. 4,865,685 and its sibling U.S. Pat. No. 4,981,551 the contents of which are incorporated entirely herein by reference. Other techniques and chemistries for carrying out the selective and non-selective etches described herein are generally well-recognized in the art and will not be described in detail herein other than to illustrate embodiments of the invention.

The term "substrate" is used herein in a sense that is broad enough to include both a bulk single crystal (usually cut from a boule) as well as a device precursor structure that can include one or more epitaxial layers, but which fundamentally (although not necessarily exclusively) serves as the physical and electronic support for a device formed thereon.

Similarly, the terms "dry etch" and "wet etch," are often used to refer to reactive ion or plasma etches ("dry") or to etches in molten salts or other solutions ("wet").

In a preferred embodiment, the initial non-selective etch is carried out to a depth of approximately five microns. A standard etch, by way of comparison, only removes about one micron of material, because a more extensive RIE etch may tend to create a large number of auto-masking defects and pits on the wafer.

Following the nonselective etch, the method comprises conducting a selective etch on the same surface sufficient to reveal the etch pits of basal plane dislocations while avoiding creating beta (i.e., the 3C polytype) inclusions and carrot defects in subsequent epilayer growth. In preferred embodiments the selective etch is carried out with a molten salt, with molten potassium hydroxide ($KOH_{(l)}$) being one such preferred salt. The nature of molten salt etches is generally well understood by those of skill in this art and will not otherwise be described in detail. In somewhat simplistic terms, the selective etch is the functional opposite of crystal growth; i.e., in the same manner that a crystal tends to grow differently at different structural features, the etch will tend to remove material differently at different structural features, and thus highlight them.

The potassium hydroxide etch is typically carried out for between about 20 and 45 minutes at a temperature of about 450° Centigrade. In establishing the time and temperature, an insufficient KOH etch will not sufficiently reveal basal plane dislocations. Alternatively, an excessive KOH etching will create 3C (beta) polytype inclusions and carrot defects during subsequent epilayer growth on the etched surface. In most cases, the temperature of about 450° C. keeps the etch appropriately selective. A higher temperature etch tends to become non-selective and produce an undesired set of resulting broader pits. For example, 600° C. appears to be too high as one empirical upper limit, while the melting point of the etchant represents the functional lower limit.

Performing a mild KOH etch of the substrate after the extended dry etch tends to further reduce the basal plane dislocation density in epilayers that are later grown on the substrate. This improvement is attributed to the different growth mechanism over the morphology (etch pit) in the immediate region where the basal plane dislocation intersects the substrate surface. The KOH etch delineates the basal plane immediately down-step from the dislocation. As epilayer growth progresses on this surface, there is an enhanced opportunity for the basal plane dislocation to reorient to a threading dislocation and thereby reduce the total dislocation length and also reduce the free energy of the crystal.

Stated differently, the selective etch helps create a morphology that encourages dislocations that have originated as basal plane dislocations to either terminate or to thereafter propagate (into epilayers) as threading dislocations. In turn, the threading dislocations tend to remain unaffected (or at least much less affected) by forward voltage during operation of resulting devices.

The selective etch can also be carried out using a eutectic, or near eutectic, etchant; e.g. of molten KOH and sodium hydroxide (NaOH)

Controlling two main factors encourages a consistent etch: etch rate and selectivity. The etch rate is normally expressed in terms such as microns etched per hour. In general, etch rate increases as etchant temperature increases.

Selectivity describes how local variations in the sample being etched impacts the local etch rate. As used herein, selectivity refers to the ratio of the etch rate on the carbon face of a wafer to the etch rate on the silicon face of the wafer. A similar selectivity, in response to variations in local crystal strain, is exhibited on a particular face by the extent to which a distinct etch pit forms at the intersection of a dislocation with the sample surface. For basal plane dislocation conversion, the shape and size of the etch pit plays a significant role in the efficacy of the conversion. As is typical with chemical etchants, the selectivity decreases with increasing etch temperature.

For a selective etch used as a prelude to the conversion of basal plane dislocations, a low etch rate favors repeatability. Because a slower etch rate requires a longer etch time, any inadvertent variations in the etch time have a proportionally reduced impact. Molten KOH etching is not as easily performed as most wet etches, and the immersion and removal steps are cumbersome and hard to standardize. This favors using a lower etch temperature.

The desire for selectivity also favors using a lower etch temperature. In practice, an etch temperature of between about 400 and 450° C. works as a good compromise. Lower temperatures unfavorably approach the freezing point of KOH (about 360° C.) while higher temperatures (as noted above) lower the resulting selectivity. Additionally as the etchant is used and becomes more contaminated, the freezing point seems to gradually increase. As a result, the etch begins to approach the lower temperature limit, and when the relatively cool wafers are immersed, some KOH will tend to freeze onto the wafer and create odd etch artifacts.

The eutectic etch of KOH and NaOH behaves (etch rate and selectivity) about the same as pure KOH at a given temperatures. As a benefit, however, the eutectic etch has a melting (freezing) point of about 170° C.; i.e., within a much more stable realm.

Although by formal definition, the eutectic of KOH and NaOH is the proportional combination with the lowest melting point, in practice the actual etchant composition can differ, either inadvertently or deliberately, for a number of reasons. For example if one component of the solution is preferentially depleted, the initial composition may be offset from the exact eutectic.

Following the nonselective and selective etches, the method next comprises growing a semi-sacrificial epitaxial layer, preferably (but not necessarily) of n-type conductivity, on the selectively etched substrate surface to a thickness much greater (e.g. at least about 50 percent greater) than that of the typical threading dislocation etch pit depth (which are generally deeper than basal etch pits) in the selectively-etched surface to thereby provide the epitaxial layer with a sufficient thickness to support additional polishing and etching steps above the substrate. Once the semi-sacrificial layer is sufficient to support the following steps, additional thickness offers no extra advantage, and an overly-thick layer adds nothing other than the need to remove additional material for its own sake. In preferred embodiments, the semi-sacrificial epilayer is about 30-50 microns (μ) thick to provide at least about 15μ for polishing removal, about 5μ for additional RIE removal (these steps are described immediately below) and about 10μ of improved material remaining as the desired epilayer surface.

Generally—but not necessarily—the substrate will be n-type, because n-type substrates offer a number of advantages in silicon carbide-based devices, and will have an activated carrier concentration of about 1E18-1E19 ($1\times10^{18}$-$1\times10^{19}$ carriers per cm$^3$). In comparison to the substrate, the carrier concentration of the epitaxial layer is selected (or described) in terms of its purpose. "Conductive" layers will typically have a carrier concentration of 1E18-19. "Blocking" layers will typically have carrier concentrations less than 1E16. "Active" layers will have carrier concentrations within these parameters, depending on the structure or purpose of the end device. Accordingly, although terms such as n, n+ and n– can be used to describe both substrates and epilayers, such terminology should be considered in an illustrative rather than a limiting sense.

In a next step, the method of the invention comprises polishing away a sufficient portion of the semi-sacrificial epitaxial layer, typically about 15μ, to remove the material containing the etched pits to thereby provide a surface with fewer pits than the surface of the original substrate. In preferred embodiments, the polishing can be carried out chemically or mechanically or both, with such steps being generally well-understood in this art.

In a final preparation step, the method of the invention thereafter comprises conducting a second non-selective etch (with RIE being typically preferred) of the semi-sacrificial epilayer sufficient to remove subsurface damage from the polishing step, but without reaching the underlying substrate, to thereby reduce the number of subsurface defects that can propagate stacking faults under forward voltage in a device formed on the substrate. In a preferred embodiment, the second non-selective etch is used to remove about 5 more microns from the semi-sacrificial layer.

Because the method of the invention provides a superior surface for epilayer growth, the method can further comprise forming a bipolar device by forming a n-type epitaxial layer above the polished and etched surface of the epitaxial layer, and forming a p-type epitaxial layer above the polished and etched surface of the epitaxial layer, with a p-n junction between the n-type and p-type epitaxial layers. As used herein, the phrase "above" a layer can include forming one layer immediately upon another layer, or on one or more intermediate layers provided that the intermediate layers do not otherwise interfere with the layers of interest. Such intermediate layers may be included for various structural or functional purposes, including providing appropriate buffers and transition layers in a device or device precursor that do not otherwise affect the basic design of the desired bipolar device. In this manner, the invention can be advantageously incorporated into any semiconductor device that experiences $V_f$ drift or performance degradation similar to $V_f$ drift such as recombination enhanced dislocation glide.

In preferred embodiments, preparing a bipolar device includes the steps of etching the n-type silicon carbide substrate, growing, polishing and etching the semi-sacrificial n+ epitaxial layer on the selectively etched substrate surface, growing an n-type epitaxial layer above the polished and etched n+ epitaxial layer, and growing a p-type epitaxial layer above the n-type epitaxial layer, with a p-n junction between the n-type and p-type epitaxial layers.

The silicon carbide substrate upon which the device is formed can be taken from a larger crystal (or "boule"), typically by the steps of sawing a silicon carbide substrate wafer from a silicon carbide boule, and thereafter conducting the nonselective etch on the substrate wafer. In most circumstances, the sawed substrate wafer is lapped, polished, etched (typically RIE), and cleaned (with an acid or solvent) prior to conducting the first isotropic (nonselective) etch of the method of the invention. The term "lapped" is used in its typical sense; i.e., to describe the steps of flattening the wafer surfaces using a counter-rotating lapping machine and an abrasive (e.g. diamond) slurry. Lapping helps make the wafer surfaces parallel and reduces mechanical defects such as saw markings. Similarly, the polishing etching and cleaning steps are otherwise carried out conventionally prior to the steps of the present invention.

The invention advantageously reduces the density of basal plane dislocations in the epilayer by a factor of at least two orders of magnitude as compared to more conventional techniques. This reduction in basal plane dislocation density along with the measures identified to isolate active device regions from the substrate and surface defects discussed in previously-incorporated U.S. Pat. No. 6,849,874 represent a major step to commercializing SiC bipolar devices.

Additional aspects of the invention can be understood with respect to the drawings.

FIG. 1 is a micrograph of the surface of a silicon carbide epitaxial layer etched with potassium hydroxide (KOH) and revealing various common types of dislocation pits. As set forth elsewhere herein, many types of dislocations can impact device performance, but the basal plane dislocations are particularly implicated as being the prevalent nucleation site of the stacking faults that cause the undesired drift under forward bias. In FIG. 1, several (but not necessarily all) of the basal plane dislocation etch pits are designated at 10. A micropipe is designated at 11, a threading screw dislocation at 12, and threading edge dislocations at 13. The basal plane dislocation etch pits are in part identified by having a generally oval shape with one frequently faceted edge, with the deepest part of the pit being visible nearest to the faceted edge. The micropipe 11 is identified by its generally larger size and its hexagonal geometry characteristic of the crystal packing structure of silicon carbide. The threading screw dislocations are identified with the deepest portion being at or near the center of the pit. Because the photographed surface has an 8° off-axis orientation with respect to the basal plane, the etch pit bottoms in FIG. 1 appear slightly off-center.

Figure 2:
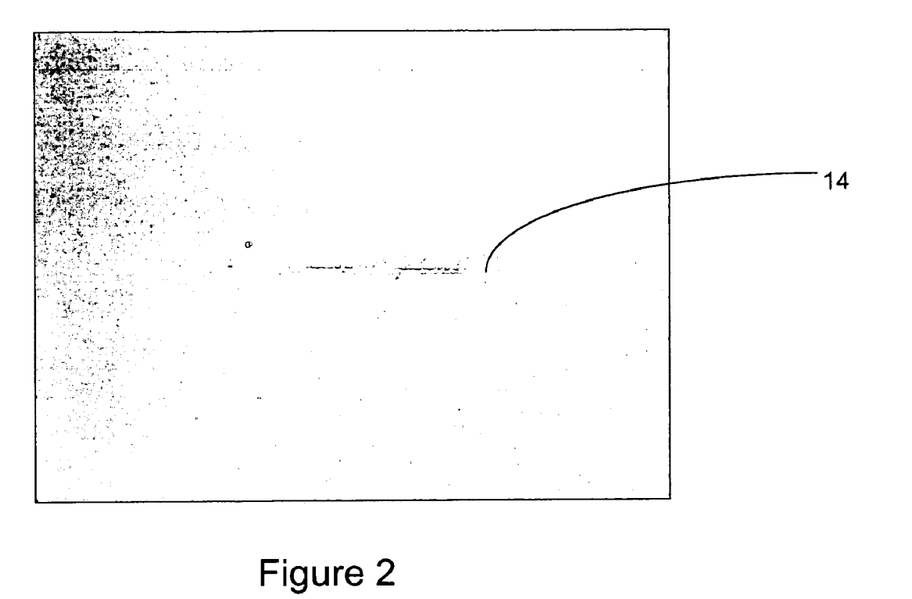
FIG. 2 is a photograph of a carrot defect on a SiC surface.
Figure 3:
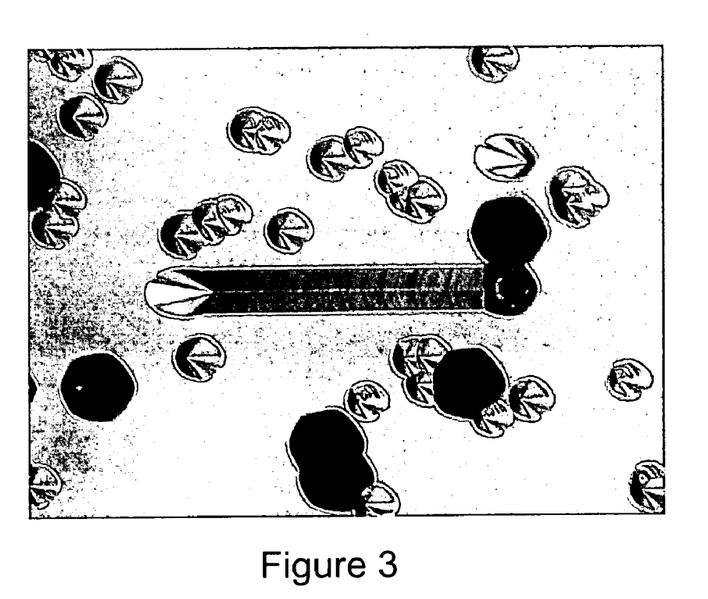
FIG. 3 is a photograph of the same carrot defect following an etch in molten KOH.

FIG. 2 illustrates a carrot defect 14 (identified by its characteristic shape, from which it derives its name) on the surface of the silicon carbide epitaxial layer. FIG. 3 is a photograph of the surface of FIG. 2, following the potassium hydroxide etch and showing the manner in which the etch delineates the carrot defect along with the basal plane dislocations, the threading screws and the threading edge dislocations.

FIG. 3 illustrates the same surface as FIG. 2, but after a KOH etch of the type used and described herein has developed pits corresponding to the carrot defect, as well as to basal plane and threading screw and threading edge dislocations.

Figure 4:
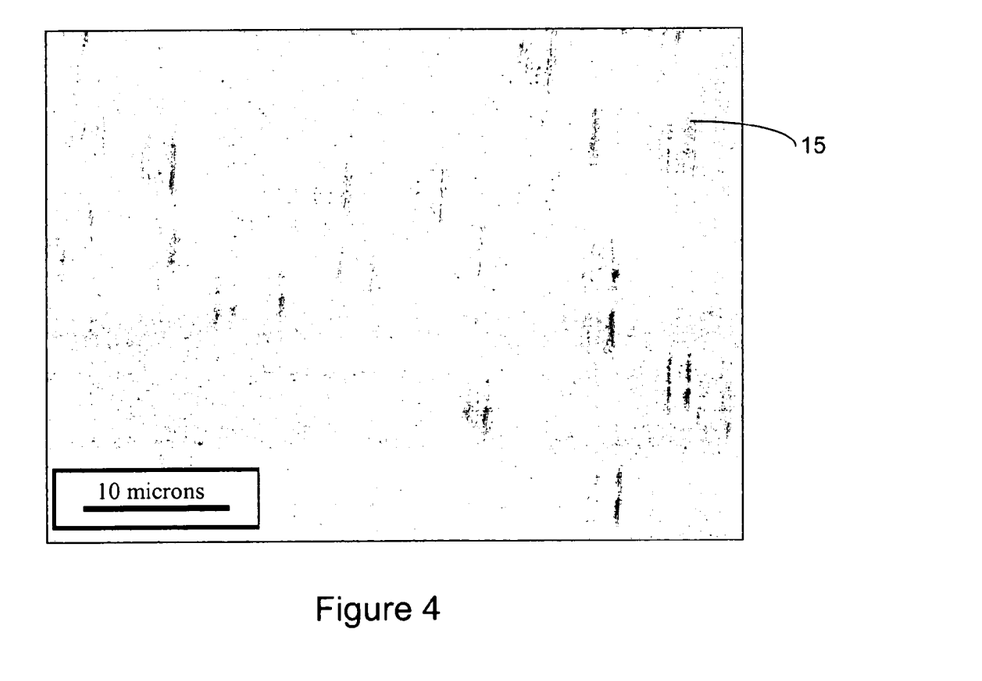
FIG. 4 is a photograph of a SiC surface that has been etched from Si droplets that formed during epilayer growth.

FIG. 4 illustrates a plurality of etched portions 15 on the surface of a silicon carbide epitaxial layer that form when silicon droplets etch the silicon carbide surface during epitaxial layer growth.

Figure 5:
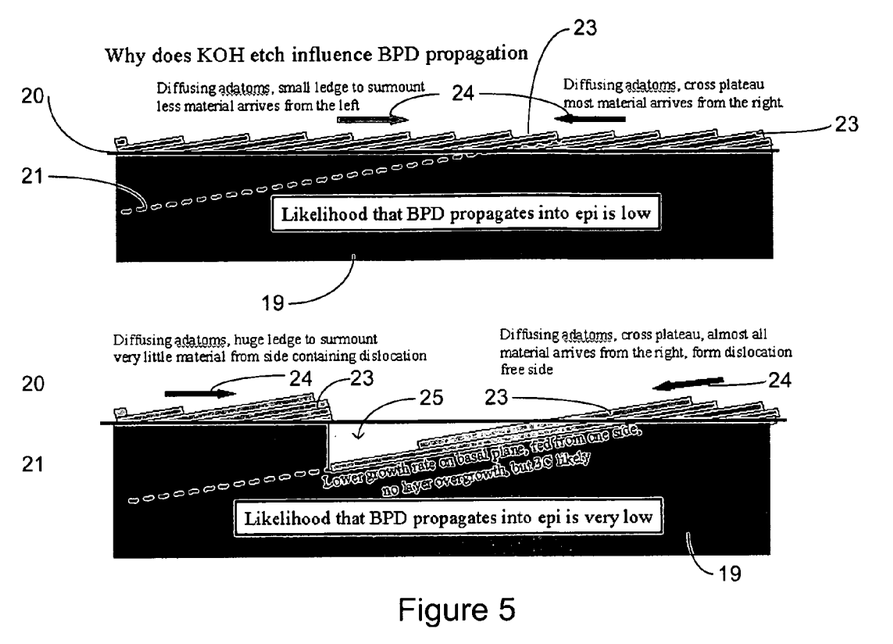
FIG. 5 is a schematic diagram of the influence of a KOH etch on the propagation of basal plane defects.

FIG. 5 schematically illustrates the manner in which the selective etch can favorably influence the propagation of basal plane defects into threading dislocations. In FIG. 5, the surface of a substrate 19 is designated at 20 and a basal plane is designated at 21, and is off axis (8° in preferred embodiments) from the substrate surface 20 for other favorable growth purposes. Individual layers of atoms in the crystal are designated at 23. During epitaxial growth, "adatoms" (those atoms from the source gases that form the growing crystal) represented by the arrows 24 diffuse across the substrate surface 20 and add to the available sites on the crystal surface. Because the crystal is oriented 8° off-axis, atoms moving from right to left tend to add to the crystal more easily and frequently than those moving from left to right.

When the substrate 19 is etched and an etch pit (designated at 25) develops from a basal plane dislocation, the resulting morphology creates an even greater tendency for diffusing adatoms to add as they move from right to left and an even smaller tendency for them to add if moving from left to right. The resulting growth tends to favor a threading structure rather than a planar defect and such threading structures, as noted previously, appear to have little or no negative effect when a bias is applied to a resulting device.

Figure 6:
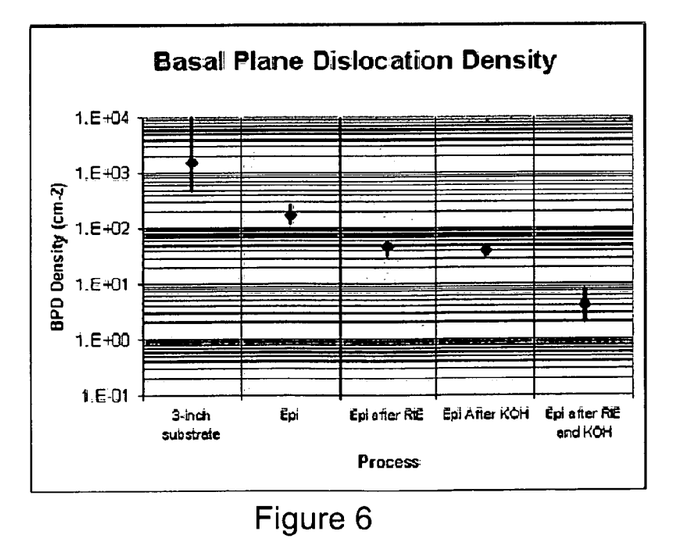
FIG. 6 is a plot of basal plane dislocation density versus surface preparation technique.

FIG. 6 presents some characteristic data from the basal plane dislocation reduction work, and plots basal plane dislocation density (as described earlier in pits-cm$^{-2}$) on a logarithmic Y-axis against the progressive preparation techniques for three-inch wafers along the X-axis. As set forth therein, a typical substrate includes about $10^3$-$10^5$ cm$^{-2}$ dislocations, following which growing an epitaxial layer reduces the density by about an order of magnitude (to about $10^2$-$10^3$ cm$^{-2}$). Using either RIE or a molten KOH etch (but not both), the density can be reduced by about another order of magnitude (about 40-50 cm$^{-2}$ in FIG. 6), but neither RIE nor KOH shows a significant improvement over the other. Using the invention, however, the dislocation density can be reduced by yet another order of magnitude, i.e., to about 4-5 cm$^{-2}$ for the data reported in FIG. 6.

In order to take further advantage of the defect reduction in the substrate, the growth conditions for later (e.g. device) epilayers can be optimized to enhance the likelihood that the basal plane dislocations will become threading dislocations. Principally, this involves adjusting pre-etch, starting growth rate, and stoichiometry to generate a facile environment for dislocation turning.

Lastly, it is also possible to generate dislocation loops during epilayer growth. These loops can contain sections where the dislocation exhibits a basal character and these loop segments can decompose into Shockley partials and generate stacking faults. Epilayer growth conditions must be employed such that the loops do not form. In practice this means maintaining adequate surface mobility of adatoms (via sufficient temperature and stoichiometry) such that there is sufficient time to accommodate impinging material properly into the crystal before the additional depositing layers lock the previously deposited material in place.

The invention focuses on the behavior of a class of dislocations that historically have not been well addressed in SiC epilayer growth technology. The extended etches differ substantially from conventional practice. KOH etching or selectively etching the substrate prior to epilayer growth is very atypical. Ramping of growth rate is also unusual especially because doping and crystal quality control become problematic during the ramp. However these unusual steps offer the opportunity to dramatically reduce $V_f$ drift as a technology limiting issue. The impact of these steps on device properties other than $V_f$ drift remains to be evaluated.

The removal of damaged material by the extended dry etch can be accomplished by numerous other approaches. Sputtering, ion-milling, wet etching and CMP are some obvious alternatives. Further, refinements in the wafer shaping and polishing processes may reduce or eliminate the need for sub-surface damage removal.

The selective KOH etch may also be replaced by another etch technique or may be incorporated into final surface preparation steps or into an in-situ pre-epilayer growth treatment.

The approach can be of value for the production of any semiconductor device which experiences Vf drift or performance degradation similar to Vf drift such as recombination enhanced dislocation glide.

The techniques referred to herein are, taken individually, generally well-recognized and well-understood in the art and can be practiced without undue experimentation. Single crystal silicon carbide wafers of the type preferably used as starting structures herein are commercially available from Cree, Inc. 4600 Silicon Drive, Durham, N.C. 27706. The growth of silicon carbide epitaxial layers can be carried out using techniques such as those set forth in U.S. Pat. Nos. 4,912,063; 4,912,064; 5,679,153; and 6,297,522. Dry and electrolytic etching of silicon carbide are described in U.S. Pat. Nos. 6,034,001; 5,571,374; 5,227,034; 4,981,551; and 4,865,685. The use of molten potassium hydroxide as an etchant to identify and characterize a semiconductor surface is well-understood, and includes versions expressed as ASTM standards (e.g. ASTM F1404.92). Cutting, mechanical polishing and lapping of substrate wafers are also entirely conventional in this art.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A method of preparing a substrate for reducing stacking fault nucleation and reducing forward voltage ($V_f$) drift in silicon carbide-based bipolar devices, the method comprising:

conducting a selective etch on the surface of a silicon carbide substrate sufficient to delineate the basal plane dislocations with the wafer surface and that will thereafter tend to terminate or to propagate as threading defects while avoiding creating beta (3C) inclusions and carrot defects;

growing a conductive epitaxial layer on the selectively etched substrate surface with a sufficient thickness to support additional polishing and etching steps above the substrate;

polishing away a sufficient portion of the conductive epitaxial layer to remove the material containing the etched pits to thereby provide a surface with fewer etched pits than the surface of the selectively-etched substrate; and thereafter conducting a non-selective etch of the epilayer sufficient to remove subsurface damage from the step of polishing the epitaxial layer but without reaching the underlying substrate, to thereby reduce the number of subsurface defects that can propagate stacking faults under forward voltage in a device formed on the substrate and the polished epilayer.

2. A substrate-preparation method according to claim 1 comprising selectively etching the surface with a molten salt.

3. A substrate-preparation method according to claim 2 comprising etching the surface with a molten salt selected from the group consisting of potassium hydroxide, mixtures of potassium hydroxide and sodium hydroxide, and a eutectic mixture of potassium hydroxide and sodium hydroxide.

4. A substrate-preparation method according to claim 1 further comprising forming a bipolar device by:
    forming a n-type epitaxial layer above the polished and etched surface of the epitaxial layer; and
    forming a p-type epitaxial layer above the polished and etched surface of the epitaxial layer, with a p-n junction between the n-type and p-type epitaxial layers.

5. A device-preparation method according to claim 4 comprising:
    etching an n-type silicon carbide substrate;
    growing, polishing and etching an n-type epitaxial layer on the selectively etched substrate surface;
    growing another n-type epitaxial layer above the polished and etched epitaxial layer; and
    growing a p-type epitaxial layer above the n-type epitaxial layer, with a p-n junction between the n-type and p-type epitaxial layers.

6. A method according to claim 1 comprising growing a first device epitaxial layer immediately on the surface prepared by the non-selective etch.

7. A method according to claim 1 comprising etching a single crystal silicon carbide substrate having a polytype selected from the 3C, 4H, 6H and 15R polytypes of silicon carbide.

8. A method of preparing a substrate and epilayer for reducing stacking fault nucleation and reducing forward voltage ($V_f$) drift in silicon carbide-based bipolar devices, the method comprising:
    selectively etching the surface of a silicon carbide substrate to thereby develop etch-generated structures from at least any basal plane dislocations on the substrate that will thereafter tend to either terminate or to propagate as threading dislocations during subsequent epilayer growth on the substrate surface; and thereafter
    growing a first epitaxial layer of silicon carbide on the selectively-etched surface.

9. A method according to claim 8 comprising etching the surface with a molten salt as the selective etch.

10. A method according to claim 9 comprising etching the surface with a molten salt selected from the group consisting of potassium hydroxide, mixtures of potassium hydroxide and sodium hydroxide, and a eutectic mixture of potassium hydroxide and sodium hydroxide.

11. A method according to claim 8 comprising growing a conductive epitaxial layer on the selectively-etched surface.

12. A method according to claim 10 comprising growing an n-type epitaxial layer on the selectively-etched surface.

13. A method according to claim 8 comprising growing a second conductive epilayer above the first conductive epilayer and having the opposite conductivity type from the first conductive epilayer.

14. A method according to claim 8 wherein the step of growing the first epitaxial layer comprises forming a semi-sacrificial epitaxial layer on the selectively etched surface to encourage the etched basal plane defects to reorient during subsequent growth into threaded defects;
    and further comprising the steps of:
    polishing the etched semi-sacrificial epitaxial layer to reduce etch pits; and
    etching the polished semi-sacrificial epitaxial layer to remove subsurface damage from the step of polishing the epitaxial layer but without reaching the underlying substrate, to thereby reduce the number of subsurface defects that can propagate stacking faults under forward voltage in a device formed on the substrate and the polished epilayer;
    all prior to forming the first epitaxial layer.

15. A method according to claim 14 comprising forming the semi-sacrificial layer by chemical vapor deposition.

16. A method according to claim 14 comprising polishing the etched semi-sacrificial epitaxial layer using a chemical-mechanical process.

17. A method according to claim 14 comprising etching the polished semi-sacrificial epitaxial layer using a dry etch.

18. A method according to claim 17 comprising etching the polished semi-sacrificial epitaxial layer using a reactive ion etch.

19. A method of preparing a substrate and epilayer for reducing stacking fault nucleation and reducing forward voltage ($V_f$) drift in silicon carbide-based bipolar devices, the method comprising:
    selectively etching the surface of a silicon carbide substrate from which surface and subsurface damage have been removed to thereby develop etch-generated structures from at least any basal plane dislocations on the substrate that will thereafter tend to either terminate or to propagate as threading dislocations during subsequent epilayer growth on the substrate surface; and thereafter
    growing a first conductive epitaxial layer of silicon carbide on the selectively-etched surface.

20. A method according to claim 19 comprising selectively etching the surface with a molten salt.

21. A substrate-preparation method according to claim 20 comprising etching the surface with a molten salt selected from the group consisting of potassium hydroxide, mixtures of potassium hydroxide and sodium hydroxide, and a eutectic mixture of potassium hydroxide and sodium hydroxide.

22. A method according to claim 19 comprising growing a second conductive epilayer above the first conductive epilayer and having the opposite conductivity type from the first conductive epilayer.

* * * * *